United States Patent
Schröter

(10) Patent No.: US 8,946,838 B2
(45) Date of Patent: Feb. 3, 2015

(54) RADIATION CONVERTER COMPRISING A DIRECTLY CONVERTING SEMICONDUCTOR LAYER AND METHOD FOR PRODUCING SUCH A RADIATION CONVERTER

(75) Inventor: Christian Schröter, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 428 days.

(21) Appl. No.: 13/111,275

(22) Filed: May 19, 2011

(65) Prior Publication Data

US 2011/0284978 A1  Nov. 24, 2011

(30) Foreign Application Priority Data

May 21, 2010  (DE) .......................... 10 2010 021 172

(51) Int. Cl.
*H01L 31/0224* (2006.01)
*H01L 31/0304* (2006.01)
(Continued)

(52) U.S. Cl.
CPC . *G01T 1/249* (2013.01); *G01T 1/24* (2013.01); *H01L 31/085* (2013.01)
USPC ............ 257/428; 257/E31.015; 257/E31.019; 438/93; 438/95

(58) Field of Classification Search
USPC ........... 257/428, E31.015, E31.018, E31.019, 257/E31.124; 438/93, 95
See application file for complete search history.

(56) References Cited

U.S. PATENT DOCUMENTS 5,892,227 A  4/1999 Harel
7,186,985 B2  3/2007 Iwanczyk
(Continued)

FOREIGN PATENT DOCUMENTS

CN  1167529 A  12/1997
CN  102209912 A  10/2011
(Continued)

OTHER PUBLICATIONS

M. Schieber, et al., "Thick Films of X-ray Polycrystalline Mercuric Iodide Detectors," Journal of Crystal Growth, 2001, vol. 225, pp. 118-125, ISSN 0022-0248; Others.
(Continued)

*Primary Examiner* — Cathy N Lam
(74) *Attorney, Agent, or Firm* — Harness, Dickey & Pierce, P.L.C.

(57) ABSTRACT

A radiation converter includes a directly converting semiconductor layer having grains whose interfaces predominantly run parallel to a drift direction—constrained by an electric field—of electrons liberated in the semiconductor layer. Charge carriers liberated by incident radiation quanta are accelerated in the electric field in the direction of the radiation incidence direction and on account of the columnar or pillar-like texture of the semiconductor layer, in comparison with the known radiation detectors, cross significantly fewer interfaces of the grains that are occupied by defect sites. This increases the charge carrier lifetime/mobility product in the direction of charge carrier transport. Consequently, it is possible to realize significantly thicker semiconductor layers for the counting and/or energy-selective detection of radiation quanta. This increases the absorptivity of the radiation converter which in turn makes it possible to reduce a radiation dose applied to the patient.

14 Claims, 2 Drawing Sheets

(51) Int. Cl.
*H01L 31/0296* (2006.01)
*H01L 31/18* (2006.01)
*G01T 1/24* (2006.01)
*H01L 31/08* (2006.01)

(56) References Cited

U.S. PATENT DOCUMENTS

| | | |
|---|---|---|
| 2003/0021382 A1 | 1/2003 | Patt |
| 2008/0156995 A1 | 7/2008 | Simon et al. |
| 2008/0213535 A1* | 9/2008 | Calzaferri et al. ............ 428/137 |
| 2010/0044705 A1* | 2/2010 | Langer et al. .................. 257/51 |
| 2010/0072382 A1 | 3/2010 | Green |
| 2010/0275996 A1 | 11/2010 | Tawada et al. |
| 2011/0211668 A1 | 9/2011 | Baeumer |
| 2012/0012172 A1* | 1/2012 | Schmidt et al. ............... 136/256 |

FOREIGN PATENT DOCUMENTS

| | | |
|---|---|---|
| EP | 2216826 A1 | 8/2010 |
| WO | WO 9610194 A1 | 4/1996 |
| WO | WO 02103386 A2 | 12/2002 |
| WO | WO 2006085230 A1 | 8/2006 |
| WO | WO 2010052676 A2 | 5/2010 |

OTHER PUBLICATIONS

Schieber, M. et al., Thick films of X-ray polycrystalline mercuric iodide detectors, In: Journal of Crystal Growth, 2001, vol. 225, pp. 118-125, ISSN 0022-0248; Others.
German priority application DE 10 210 021 172.9 filed on May 21, 2010 and not yet published.
German office Action.
Xinjian, Yi et al; "The principle and design of solar battery"; Press of Huazhong University of Science, pp. 239-270, claim #: 1-2; 1989; CN; Jan. 31, 1989.
Office Communication from counterpart Chinese Patent Application No. 201110134901.6 dated Sep. 19, 2014.

* cited by examiner

RADIATION CONVERTER COMPRISING A DIRECTLY CONVERTING SEMICONDUCTOR LAYER AND METHOD FOR PRODUCING SUCH A RADIATION CONVERTER

PRIORITY STATEMENT

The present application hereby claims priority under 35 U.S.C. §119 on German patent application number DE 10 2010 021 172.9 filed May 21, 2010, the entire contents of which are hereby incorporated herein by reference.

FIELD

At least one embodiment of the invention generally relates to a radiation converter comprising a directly converting semiconductor layer. At least one embodiment of the invention additionally relates to a method for producing such a radiation detector.

BACKGROUND

Radiation converters comprising a directly converting semiconductor layer enable a counting and/or an energy-selective detection of individual quantum absorption events that are incident in the semiconductor layer by way of a detection area. In this case, the radiation quanta, for example gamma or X-ray quanta, are absorbed in the semiconductor layer and converted into free charge carriers. The liberated charge carriers are accelerated in an electric field generated by the application of a voltage between a counterelectrode and a pixelated read-out electrode. The associated charge carrier transport in the semiconductor layer induces currents on the read-out electrode, said currents being tapped off by a read-out electronic unit and detected as an electrical signal.

The conversion of radiation quanta into free charge carriers is effected by in part multistage interaction processes with a semiconductor material from which the semiconductor layer is produced. Appropriate semiconductor material includes materials having high atomic numbers in order to achieve virtually complete absorption of the radiation quanta in the case of the realizable layer thicknesses of the material. Alongside the high absorptivity, the material must furthermore have a high charge carrier mobility in order to ensure complete conversion of the charge carriers into an electrical signal.

Semiconductor materials having such properties are based, for example, on CdTe, CdZnTe, CdZnTeSe, CdZnTeSe or GaAs compounds.

Semiconductor layers composed of such materials are conventionally grown as block crystals and electrically connected to the read-out electronic unit, for example to an ASIC, after corresponding processing and electrode application by means of soldering processes.

Limits of the quantitative and of the energy-selective detection arise on account of production-dictated defect sites in the crystal lattice, for example in the form of vacancies or interstitial atoms. These are responsible for polarization effects that lead to a reduction of the charge carrier lifetime/mobility product ($\mu\tau$ product) and thus to an increase in the average residence duration with at the same time a reduction in the lifetime of the charge carriers in the semiconductor material. This reduces the separation efficiency of the liberated charge carriers. There is a risk, in particular, of signals from quanta that arrive in close temporal succession being superposed in such a way that it is no longer possible to unambiguously separate the events. However, liberated charge carriers can also completely recombine with oppositely charged defect sites present, such that they are completely lost for conversion into an electrical signal.

Taking this as a departure point, the intention is to provide a radiation converter comprising a directly converting semiconductor layer which makes it possible to carry out a counting and/or energy-selective detection of absorption events in an improved form. Furthermore, the intention is to specify a method for producing such a radiation converter.

SUMMARY

In at least one embodiment, a radiation converter is disclosed, and also a method is disclosed. Dependent claims relate to advantageous refinements.

The growth of a monocrystalline layer composed of a semiconductor material for use in a radiation converter is associated with a considerable disadvantage in practice on account of the low growth rate that can be realized in this case. The semiconductor layers used for directly converting radiation quanta into electrical signals have a polycrystalline structure in which the interfaces of the grains, in a manner governed by production, have stochastically distributed orientations without a preferred direction.

In materials science, the term grains designates crystallites. These are crystallites which do not or only partly reproduce the actual crystal form. They arise if crystals solidify in a melt in which they are prevented from free growth by the surrounding crystals. In this case, the interface denotes a transition from one grain to the next. At the interfaces, positively and negatively charged defect sites form as a result of open or disordered crystal structures, said defect sites acting as recombination centers for the liberated charge carriers. Charge carrier transport via such an interface is therefore associated with a great reduction of the charge carrier lifetime/mobility product and thus with a high degree of polarization of the semiconductor layer.

Absorption events are detected by transport of the liberated charge carriers in the semiconductor layer. The charge carrier transport induces currents on the read-out electrode, said currents being tapped off by a read-out electronic unit and detected as an electrical signal. As a result of a reduction of the range of the charge carriers on account of a reduction of the charge carrier lifetime/mobility product, at the same time this also limits the maximum possible thickness of the semiconductor layer with which such detection by way of induction is still possible. On the other hand, depending on the atomic number of the semiconductor material used, specific layer thicknesses are required for complete absorption of the incident radiation quanta. These layer thicknesses are in the range of 1 mm to 2 mm. These two optimization approaches that compete with regard to the choice of layer thickness currently limit the use of directly converting radiation detectors in the human-medical field since particularly high flux rates occur in such applications.

On the basis of these insights, for the improved counting and/or energy-selective detection of absorption events, a radiation detector was proposed in which the fewest possible interfaces of grains are crossed in the direction of the transport of liberated charge carriers through the semiconductor layer. The radiation converter according to at least one embodiment of the invention correspondingly comprises a directly converting semiconductor layer, wherein the semiconductor layer has grains whose interfaces at least predominantly run parallel to a drift direction—constrained by an electric field—of electrons liberated in the semiconductor layer.

The interfaces run parallel to the drift direction within the meaning of at least one embodiment of the invention when the normal vectors of the interfaces are oriented perpendicularly to the drift direction. The semiconductor layer is typically arranged between a counterelectrode and a pixelated read-out electrode. The electric field for separating the liberated charge carriers is generated by the application of a voltage between these electrodes. In this case, the read-out electrode is typically positively charged. In this case, therefore, the drift direction of the electrons runs parallel to the radiation incidence direction of the radiation quanta or perpendicularly to a detection area of the radiation converter. The orientation of the drift direction and the associated orientation of the interfaces in the semiconductor layer can turn out correspondingly differently in the case of a different arrangement of the electrodes, for example in the case of perpendicular orientation of the electrode areas with respect to the detection area.

Liberated charge carriers are accelerated in the electric field in the direction of the radiation incidence direction and, in comparison with the known radiation detectors, on account of the columnar or pillar-like texture of the semiconductor layer, cross significantly fewer interfaces of grains. It is thus possible to realize a fast growth rate with a resultant polycrystalline structure of the semiconductor layer which is not associated with the disadvantage of a considerable rise in the number of interfaces in the direction of charge carrier transport. The defect density of the semiconductor layer is thus considerably reduced in a preferred direction, namely in the direction of the radiation incidence direction. This increases the charge carrier lifetime/mobility product. As a result of the associated greater range of the charge carriers during transport through the semiconductor layer, larger thicknesses can be realized in favor of the absorptivity of X-rays. A counting and/or energy-selective detection of absorption events is thus possible in an improved form. Particularly in the case of flat panel detectors, gamma cameras and in the case of detectors for computed tomography apparatuses, PET and SPECT apparatuses, this leads to a significant reduction of the dose.

In one particularly advantageous configuration of at least one embodiment of the invention, the interfaces extend continuously over the entire layer thickness of the semiconductor layer. In this special case, therefore, no interfaces whatsoever are crossed during charge carrier transport, such that the charge carrier lifetime/mobility product is particularly high by comparison with the known solutions and the associated advantages are particularly pronounced.

Grains having a pillar-like structure can be produced by way of a targeted growth process. One possibility for controlled growth consists in arranging the semiconductor layer on a seed layer. The use of a seed layer makes it possible as it were to constrain the growth of the semiconductor layer with a specific predefined orientation of the grains.

In this case, the seed layer preferably has a layer thickness of a few nanometers, preferably in a range of 1 nm to 10 μm. Seed layers in this range can be used without disadvantageously influencing the function and/or coupling of the semiconductor layer to a read-out electrode. The seed layers do not have to be coordinated with the semiconductor material in particular with regard to their chemical or physical properties, e.g. with regard to a doping present in the semiconductor layer or an electrical conductivity. As a result, the material selection can be selected from the standpoint of optimally constrained crystal growth.

The seed layer, like the semiconductor layer itself as well, is advantageously produced from a semiconductor material, preferably from a CdTe, CdZnTe, CdZnTeSe, CdMnTeSe or a GaAs semiconductor material. Alternatively it would likewise advantageously be conceivable to produce the seed layer from a metal, preferably from Pt. Said metal has a 1-1-1 texture and thus ensures ordered cubic growth—imposed over the seed layer—of the grains with grain boundaries parallel to the growth direction of the crystal and thus in a perpendicular direction with respect to the detection area.

In one particularly advantageous configuration of the invention, the seed layer simultaneously also fulfils the function of a read-out electrode with a pixel-like structure. The seed layer is furthermore preferably arranged directly on a read-out electronic unit. In both situations, additional production processes for fitting and electrically coupling the components among one another are obviated.

The method according to at least one embodiment of the invention for producing a radiation converter comprising a directly converting semiconductor layer according to a second aspect of the invention comprises the following method steps:

a) providing a seed layer,
b) depositing a semiconductor material on the seed layer in order to form the semiconductor layer, wherein the depositing is effected by predefining process parameters such that grains are formed whose interfaces at least predominantly run parallel to a drift direction—constrained by an electric field—of electrons liberated in the semiconductor layer.

As already mentioned above, providing the seed layer is advantageously effected by a semiconductor material or a metal having a layer thickness of a few nanometers, preferably in a range of 1 nm to 10 μm, being deposited on a read-out electronic unit.

In this case, a CdTe, CdZnTe, CdZnTeSe, CdMnTeSe or a GaAs semiconductor material is advantageously used as semiconductor material for the seed layer. As an alternative thereto, it is also possible to use a metal, for example Pt, as seed layer. In one example embodiment of the method, the seed layer is structured in a pixel-like manner and used as a read-out electrode. Furthermore, the seed layer is advantageously applied directly on a read-out electronic unit.

Two temperature levels are passed through temporally successively during the process of depositing for forming the semiconductor layer, wherein at least one position of one of the temperature levels, a time window for the heat treatment at one of the temperature levels and/or a temperature gradient for attaining one of the temperature levels are set as process parameters.

BRIEF DESCRIPTION OF THE DRAWINGS

The invention is explained in greater detail below on the basis of exemplary embodiments and with reference to drawings, in which.

In the figures, identical or functionally identical elements are designated by identical reference symbols. In the case of recurring elements in a figure, only one element is respectively provided with a reference symbol for reasons of clarity.

Figure 1:
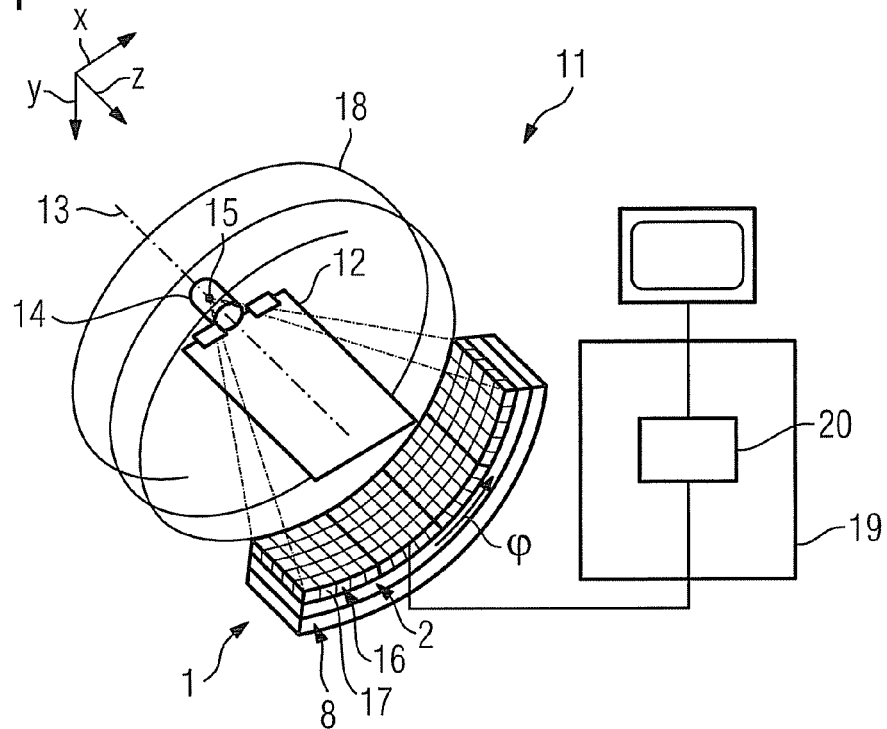
FIG. 1 shows a computed tomography apparatus comprising a radiation detector according to an embodiment of the invention in a schematic illustration.

The illustrations in the figures are schematic and not necessarily true to scale, in which case scales can vary between the figures.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 illustrates a computed tomography apparatus 11 comprising a radiation converter 1 according to an embodiment of the invention in partly perspective, partly block-diagram-like view. The computed tomography apparatus 11 comprises a patient supporting couch 12 for supporting a patient to be examined. It furthermore comprises a gantry (not illustrated), with a recording system 14, 1 mounted such that it is rotatable about a system axis 13. The recording system 14, 1 has an X-ray tube 14 and a radiation converter 1 according to an embodiment of the invention, said radiation converter being illustrated in more detail in FIG. 2, which are oriented opposite one another in such a way that an X-ray radiation emerging from the focus 15 of the X-ray tube 14 during operation impinges on the radiation converter 1.

In order to suppress the scattered radiation generated in the patient, a collimator 16 is disposed upstream of the radiation converter 1, said collimator only transmitting the primary radiation that emerges from the focus 15 and is attenuated depending on the irradiation of the patient onto the radiation converter 1. The radiation converter 1 has a semiconductor layer 2, in which the incident X-ray quanta are converted into free charge carriers and detected as electrical signals by way of a downstream read-out electronic unit 8 as a result of charge carrier transport constrained in an electric field. The radiation converter 1 is subdivided into individual pixels 17 for the spatially resolved detection of the absorption events.

For recording an image of an examination region, upon rotation of the recording system 14, 1 about the system axis 13, projections from a multiplicity of different projection directions are detected, wherein, for each projection and for each pixel 17, the radiation converter 1 supplies electrical signals from which raw image data are generated in a counting and optionally in an energy-selective manner. In the case of spiral scanning, by way of example, a continuous adjustment of the patient supporting couch 12 in the direction of the system axis 13 is effected simultaneously during a rotation of the recording system 14, 1. In the case of this type of scanning, therefore, the X-ray tube 14 and the radiation converter 1 move on a helical path 18 around the patient. The raw image data generated are serialized in a sequencer and subsequently transmitted to an image computer 19. The image computer 19 contains a reconstruction unit 20, which reconstructs from the raw image data an image, e.g. in the form of a slice image of the patient, according to a method known per se to the person skilled in the art. The image can be displayed on a display unit 21, e.g. a video monitor, connected to the image computer 19.

Figure 2:
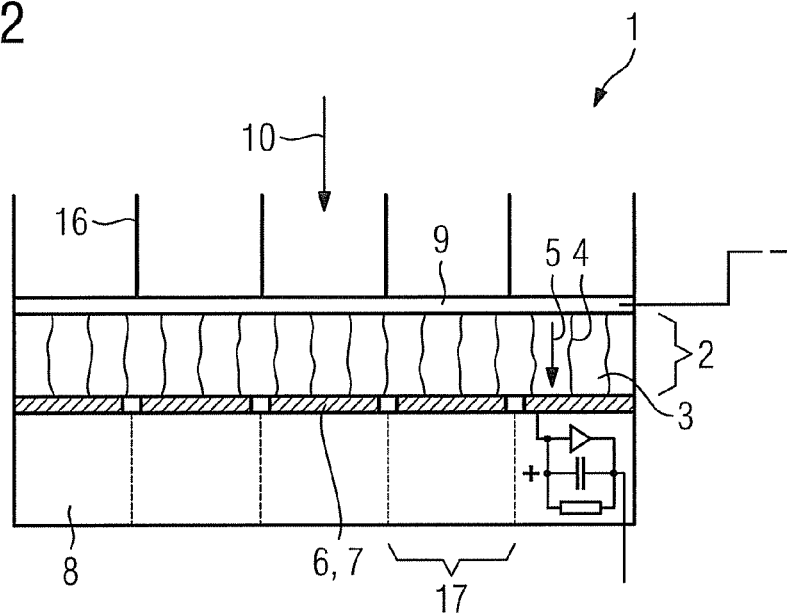
FIG. 2 shows a radiation detector according to an embodiment of the invention in side view.

FIG. 2 shows the radiation converter 1 according to an embodiment of the invention in a side view. The directly converting semiconductor layer 2 is produced from a semiconductor material, for example from a CdTe, CdZnTe, CdZnTeSe, CdMnTeSe or a GaAs semiconductor material, and has a polycrystalline structure. In this case, the grains 3 of the semiconductor layer 2 that are formed by a fast growth process have a columnar or pillar-like texture. In the present example embodiment, the grains 3 have no interfaces 4 or grain boundaries over the entire thickness of the semiconductor layer 2. A counterelectrode 9, which is embodied in an areal fashion in this example embodiment, is arranged on a radiation entrance side of the semiconductor layer 2, which corresponds to the detection area. A read-out electrode 7 with a pixel-like structure is situated on the opposite side.

An electric field for separating the charge carriers liberated by X-ray quanta is generated between the two electrodes 7, 9. In the present example, the read-out electrode 7 is positively charged and the counterelectrode 9 is negatively charged. The transport of the free charge carriers which is mediated by the electric field therefore takes place in the radiation incidence direction 10 or perpendicularly to the detection area. By virtue of the fact that the interfaces 4 between adjacent grains 3 run virtually parallel to the drift direction 5 of the electrons, in the ideal case no interfaces 4 occupied by defect sites are crossed in the semiconductor layer 2. For this direction, therefore, the radiation converter 1 has a low degree of polarization.

The read-out electrode 7 is arranged directly on a read-out electronic unit 8. It is used to detect, for each pixel 17, the currents induced on the read-out electrode 8 by the transport of the electrons in the semiconductor layer 2 as an electrical signal and to forward the latter to downstream signal processing limits.

In this example embodiment, the read-out electrode 7 simultaneously performs the function of a seed layer 6 used during the process for producing the semiconductor layer 2. It is produced from a metal, from Pt in this example embodiment. The 1-1-1 texture of said material allows cubic growth of the grains 3 in the semiconductor layer 2 with interfaces 4 oriented perpendicularly to the detection area. The layer thickness of the seed layer 6 is a few nanometers to micrometers. However, it would likewise be conceivable to use a separate seed layer 6 for producing the semiconductor layer 2. In this case, semiconductors from the material families CdTe, CZT and GaAs are preferably used as the seed layer 6. However, the seed layer 6 can also originate from a different family than the material of the semiconductor layer 2. This is because it is not necessary for the seed layer 6 to have the same properties as the semiconductor layer with regard to composition, in particular with regard to a doping present in the semiconductor material, or with regard to the electrical properties, for example with regard to the electrical resistance.

In the present example embodiment, the read-out electrode 7 or the seed layer 6 is deposited or arranged directly on the read-out electronic unit 8. Further coupling layers, either metallic or not, can also be arranged between the seed layer 6 and the read-out electronic unit 8.

Figure 3:
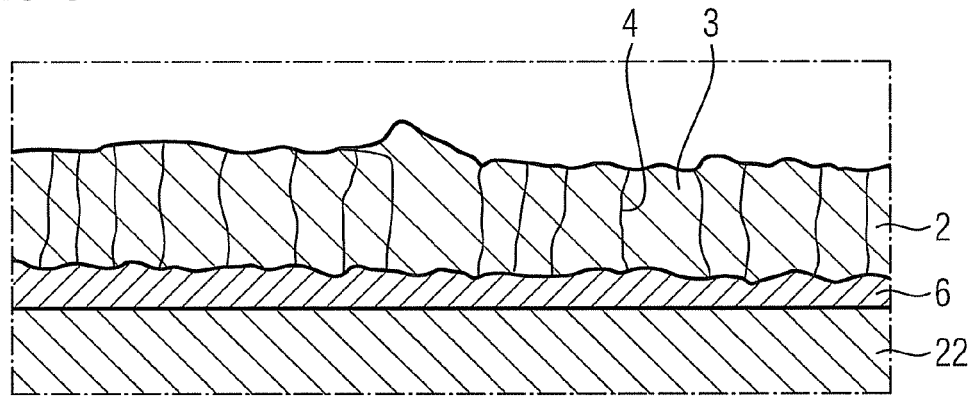
FIG. 3 shows, in a section perpendicular to a detection area of the radiation converter, an excerpt from a semiconductor layer with a columnar texture.

FIG. 3 shows in detail an excerpt from a semiconductor layer 2 having a columnar texture in a section perpendicular to the detection area. In this case, the seed layer 6 for the growth of the semiconductor layer 2 was arranged on a substrate 22.

Figure 4:
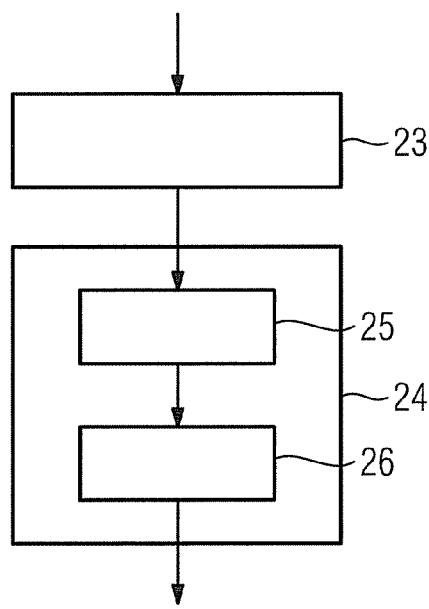
FIG. 4 shows a method for producing the radiation converter in an illustration like a block diagram.

FIG. 4 shows, like a block diagram, a method for producing a radiation converter 1 comprising a directly converting semiconductor layer 2. The method substantially comprises the following method steps:

a) 23 providing a seed layer 6, and
b) 24 depositing a semiconductor material on the seed layer 6 in order to form the semiconductor layer 2, wherein the depositing is effected by predefining process parameters such that grains 3 are formed whose interfaces 4 at least predominantly run parallel to a drift direction 5—constrained by an electric field—of electrons, liberated in the semiconductor layer 2.
b1) 25 In a first phase, a temperature level of, for example, approximately 500° C. with a quadruply increased tellurium partial pressure is set in this case.
b2) 26 In a subsequent second phase, the temperature level is reduced to approximately 300° C.

In addition, a time window for heat treatment at the temperature levels, a surrounding atmosphere and a temperature gradient for attaining the temperature levels are set as process parameters such that a grain orientation parallel to the drift direction 5 of electrons that is produced in the semiconductor layer 2 is established.

To summarize, it can be stated that:

An embodiment of the invention relates to a radiation converter comprising a directly converting semiconductor layer 2, wherein the semiconductor layer 2 has grains 3 whose interfaces 4 at least predominantly run parallel to a drift direction 5—constrained by an electric field—of electrons liberated in the semiconductor layer 2. The charge carriers liberated by incident radiation quanta are accelerated in the electric field in the direction of the radiation incidence direction 10 and on account of the columnar or pillar-like texture of the semiconductor layer 2, in comparison with the known radiation detectors, cross significantly fewer interfaces 4 of the grains 3 that are occupied by defect sites. This increases the charge carrier lifetime/mobility product in the direction of charge carrier transport. Consequently, it is possible to realize significantly thicker semiconductor layers 2 for the counting and/or energy-selective detection of radiation quanta. This increases the absorptivity of the radiation converter 1 which in turn makes it possible to reduce a radiation dose applied to the patient. An embodiment of the invention additionally relates to a method for producing such a radiation converter 1.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An X-ray radiation converter, comprising:
   a counter electrode;
   a read-out electrode; and
   a directly converting semiconductor layer between the counter electrode and the read-out electrode of the X-ray radiation converter, wherein the semiconductor layer includes grains whose interfaces at least predominantly run parallel to a drift direction, constrained by an electric field, the electric field generated by the application of a voltage between the counter electrode and the read-out electrode.

2. The X-ray radiation converter as claimed in claim 1, wherein the interfaces extend continuously over an entire layer thickness of the semiconductor layer.

3. The X-ray radiation converter as claimed in claim 1, wherein the semiconductor layer is arranged on a seed layer.

4. The X-ray radiation converter as claimed in claim 3, wherein the seed layer includes a layer thickness of a few nanometers.

5. The X-ray radiation converter as claimed in claim 3, wherein the seed layer is produced from a semiconductor material.

6. The X-ray radiation converter as claimed in claim 3, wherein the seed layer is produced from a metal.

7. The X-ray radiation converter as claimed in claim 3, wherein the seed layer forms a read-out electrode with a pixel-like structure.

8. The X-ray radiation converter as claimed in claim 3, wherein the seed layer is arranged directly on a read-out electronic unit.

9. The X-ray radiation converter as claimed in claim 2, wherein the semiconductor layer is arranged on a seed layer.

10. The X-ray radiation converter as claimed in claim 4, wherein the seed layer includes a layer thickness in a range of 1 nm to 10 µm.

11. The X-ray radiation converter as claimed in claim 4, wherein the seed layer is produced from a semiconductor material.

12. The X-ray radiation converter as claimed in claim 5, wherein the semiconductor material is CdTe, CdZnTe, CdZnTeSe, CdMnTeSe or a GaAs semiconductor material.

13. The X-ray radiation converster as claimed in claim 4, wherein the seed layer is produced from a metal.

14. The X-ray radiation converter as claimed in claim 6, wherein the seed layer is produced from Pt.

* * * * *